United States Patent
Ookura

(10) Patent No.: US 8,022,442 B2
(45) Date of Patent: Sep. 20, 2011

(54) SEMICONDUCTOR DEVICE HAVING STI WITH NITRIDE LINER AND UV LIGHT SHIELDING FILM

(75) Inventor: Yoshiyuki Ookura, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 267 days.

(21) Appl. No.: 10/972,326

(22) Filed: Oct. 26, 2004

(65) Prior Publication Data

US 2006/0001104 A1    Jan. 5, 2006

(30) Foreign Application Priority Data

Jun. 30, 2004 (JP) ................................. 2004-192744

(51) Int. Cl.
*H01L 23/52* (2006.01)
(52) U.S. Cl. ........ 257/211; 257/368; 257/369; 257/649; 257/758; 257/760; 257/E51.006
(58) Field of Classification Search .................. 257/211, 257/288, 368, 369, 646, 649, 758, 759, 760, 257/E51.006, E31.122, E23.142, E23.145
See application file for complete search history.

(56) References Cited

U.S. PATENT DOCUMENTS

| | | | | |
|---|---|---|---|---|
| 4,525,383 A * | 6/1985 | Saito | ............................ | 427/96.8 |
| 5,422,290 A * | 6/1995 | Grubisch | ...................... | 438/234 |
| 5,447,884 A | 9/1995 | Fahey et al. | | |
| 5,686,980 A * | 11/1997 | Hirayama et al. | ............ | 349/110 |
| 5,989,978 A * | 11/1999 | Peidous | ........................ | 438/436 |
| 6,559,044 B1 * | 5/2003 | Chen et al. | .................... | 438/620 |
| 7,037,803 B2 * | 5/2006 | Inoue et al. | .................... | 438/424 |
| 7,091,088 B1 * | 8/2006 | Cheng et al. | .................. | 438/257 |
| 7,098,107 B2 * | 8/2006 | Bloom et al. | ................. | 438/261 |
| 7,319,065 B1 * | 1/2008 | Yu et al. | ......................... | 438/622 |
| 2001/0026952 A1 * | 10/2001 | Engelhardt | ................... | 438/100 |
| 2004/0192032 A1 * | 9/2004 | Ohmori et al. | ............... | 438/655 |
| 2004/0212035 A1 * | 10/2004 | Yeo et al. | ...................... | 257/510 |
| 2005/0032275 A1 * | 2/2005 | Toda et al. | .................... | 438/123 |
| 2005/0051838 A1 * | 3/2005 | Roizin et al. | .................. | 257/324 |

FOREIGN PATENT DOCUMENTS

JP    11-297812    10/1999
WO    WO 03050871 A1 *    6/2003

OTHER PUBLICATIONS

K. Goto et al., 2003 Symposium on VLSI Technology Digest of Technical Papers, "High Performance 35 nm Gate CMOSFETs with Vertical Scaling and Total Stress Control for 65 nm Technology".

* cited by examiner

*Primary Examiner* — Minhloan T Tran
*Assistant Examiner* — Leslie Pilar Cruz
(74) *Attorney, Agent, or Firm* — Westerman, Hattori, Daniels & Adrian, LLP

(57) ABSTRACT

A semiconductor device has: a silicon substrate; trench formed downward from the surface of the silicon substrate, the trench defining active regions on the surface of the silicon substrate; a first liner layer of a silicon nitride film covering an inner wall of the trench; a second liner layer of a silicon nitride layer formed on the first liner layer; an element isolation region of an insulator formed on the second liner layer; a p-channel MOS transistor formed in and on one of the active regions; a contact etch stopper layer of a silicon nitride layer not having a ultraviolet shielding ability, formed above the silicon substrate, and covering the p-channel MOS transistor; and a light shielding film of a silicon nitride layer having the ultraviolet shielding ability and formed above the contact etch stopper layer.

13 Claims, 6 Drawing Sheets

SEMICONDUCTOR DEVICE HAVING STI WITH NITRIDE LINER AND UV LIGHT SHIELDING FILM

CROSS REFERENCE TO RELATED APPLICATION

This application is based on and claims priority of Japanese Patent Application No. 2004-192744 filed on Jun. 30, 2004, the entire contents of which are incorporated herein by reference.

BACKGROUND OF THE INVENTION

A) Field of the Invention

The present invention relates to a semiconductor device and its manufacture method, and more particularly to a semiconductor device having a shallow trench isolation (STI) and its manufacture method.

B) Description of the Related Art

The local oxidation of silicon, LOCOS, has been used as one of the element isolation methods for semiconductor devices. The local oxidation of silicon is the techniques wherein a silicon oxide layer is formed on a silicon substrate as a buffer layer, thereafter a silicon nitride film is formed as an oxidation preventing mask layer, the silicon nitride layer is patterned and thereafter the surface of the silicon substrate is thermally oxidized.

While the silicon substrate is thermally oxidized, oxidation seeds such as oxygen and moisture invade also into a buffer oxide silicon layer under the end portion of the silicon nitride layer and oxidize the silicon substrate surface under the end portion of the silicon nitride layer, so that a silicon oxide region of a bird's beak shape called a bird's beak is formed. The region where the bird's beak is formed cannot be used substantially as the element forming region (active region) so that the element forming region is narrowed.

If a silicon nitride film having openings of various sizes is formed and the substrate surface is thermally oxidized, the thickness of a silicon oxide layer formed on the silicon substrate surface with the small opening size is thinner than the silicon oxide layer formed on the silicon substrate surface with the large opening size. This phenomenon is called thinning.

As miniaturization of semiconductor devices advances, the ratio of an area not usable as the element forming region to the whole area of a semiconductor substrate is increased by bird's beaks and thinning. Namely, the ratio of narrowing the element forming region increases, hindering the high integration of semiconductor devices.

As techniques of forming an element isolation region, trench isolation (TI) techniques are known wherein a trench is formed in the surface layer of a semiconductor substrate and insulating material or polysilicon is buried in the trench. This method has been applied to bipolar transistor LSIs which require a deep element isolation region.

Application of the trench isolation to MOS transistor LSIs has progressed because both the bird's beak and thinning will not occur. Element isolation can be realized by a relatively shallow trench of about 0.1 to 1.0 μm in depth because MOS transistor LSIs do not require a deep element isolation like bipolar transistor LSIs. This structure is called shallow trench isolation (STI).

U.S. Pat. No. 5,447,884 discloses that a pad oxide film and a pad nitride film are formed on a silicon substrate, a trench is formed by anisotropic etching by using a resist pattern, a trench inner wall is thermally oxidized, thereafter a silicon nitride layer liner having a thickness of 5 nm or thinner (a thickness preventing hot phosphoric acid from invading) is formed, a burying silicon layer is deposited on the silicon nitride layer and the pad nitride film is removed by hot phosphoric acid.

Japanese Patent Laid-open Publication No. HEI-11-297812 discloses that a trench for element isolation is formed in a silicon substrate, a silicon oxide layer and a silicon nitride liner are formed on the trench inner wall, and the upper portion of the nitride silicon liner is removed to lower the upper end of the silicon nitride layer.

"2003 Symposium on VLSI Technology Digest of Technical Papers" by K. Goto et al reports that in the structure that the upper end of a silicon nitride film liner formed on the inner wall of an element isolation trench is lowered and a contact etch stopper layer of a silicon nitride film is formed on the silicon substrate, covering the gate electrode, the drive current of a MOS transistor can be improved by controlling the stresses in both the silicon nitride films.

Although the element isolation by STI is suitable for element miniaturization, there arises the problems specific to the STI itself. Novel techniques has long been desired which can mitigate the problems specific to the STI itself.

SUMMARY OF THE INVENTION

An object of this invention is to provide a semiconductor device having a high reliability and excellent characteristics and its manufacture method.

Another object of the invention is to provide a semiconductor device having STI with a stacked liner of a silicon oxide layer and a silicon nitride layer and being capable of reducing charges, and its manufacture method.

Still another object of the invention is to provide a semiconductor device capable of increasing an on-current by exerting a proper stress and suppressing an increase in leak current, by using a silicon nitride layer liner and a silicon nitride layer contact etch stopper, and its manufacture method.

According to one aspect of the present invention, there is provided a semiconductor device comprising: a silicon substrate; a trench formed downward from a surface of the silicon substrate, the trench defining active regions on the surface of the silicon substrate; a liner layer of a silicon nitride film covering an inner wall of the trench; an element isolation region of an insulator formed on the liner layer and a p-channel MOS transistor formed in and on the active region; a contact etch stopper layer of a silicon nitride layer not having a ultraviolet shielding ability, the contact etch stopper layer being formed above the silicon substrate, covering the p-channel MOS transistor; and a light shielding film of a silicon nitride layer having the ultraviolet shielding ability and formed above the contact etch stopper layer.

According to another aspect of the present invention, there is provided a semiconductor device comprising: a silicon substrate; a trench formed downward from a surface of the silicon substrate, the trench defining active regions on the surface of the silicon substrate; a liner layer of a silicon nitride film covering an inner wall of the trench; an element isolation region of an insulator formed on the liner layer and a p-channel MOS transistor formed in and on the active region; a contact etch stopper layer of a silicon nitride layer not having a ultraviolet shielding ability, the contact etch stopper layer being formed above the silicon substrate, covering the p-channel MOS transistor; a lower interlayer insulating film of a silicon oxide containing insulating film formed on the contact etch stopper layer and having a ultraviolet shielding ability; a conductive plug formed through the lower interlayer insulating film and reaching the p-channel MOS transistor; an intermediate interlayer insulating film of an organic insulating layer covering the conductive plug, formed above the lower interlayer insulating film and not having the ultraviolet shielding ability; and a wiring formed through the intermediate interlayer insulating film and reaching the conductive plug.

According to still another aspect of the present invention, there is provided a method of manufacturing a semiconductor device comprising steps of: (a) selectively etching a silicon substrate surface to form a trench defining active regions; (b) forming a liner insulating layer of a silicon nitride layer above the silicon substrate surface exposed in the trench; (c) forming an element isolation region of an insulator by burying a recess defined by the liner insulating layer; (d) forming a p-channel MOS transistor in the active region; (e) forming a contact etch stopper layer of a silicon nitride layer above the silicon substrate surface, the contact etch stopper covering the p-channel MOS transistor and not having a ultraviolet shielding ability; and (f) forming a light shielding film of a silicon nitride layer having the ultraviolet shielding ability above the contact etch stopper layer.

It is possible to prevent ultraviolet rays from being irradiated to STI having the silicon nitride layer liner and reduce leak current.

DESCRIPTION OF THE PREFERRED EMBODIMENTS

Prior to the description of the preferred embodiments of the invention, the results of studies made by the present inventor will be described. A silicon nitride layer was formed on a buffer silicon oxide layer formed on the surface of a silicon substrate. A resist pattern was formed on the silicon nitride layer and a shallow trench was formed in the silicon substrate by etching. The silicon surface exposed in the trench was thermally oxidized and a silicon nitride layer liner was formed in the trench. A silicon oxide was deposited by high density plasma (HDP) CVD, burying the trench, and the unnecessary insulating layer on the surface of the silicon substrate was removed by chemical mechanical polishing (CMP) to form a shallow trench isolation (STI). A MOS transistor was formed in an active region defined by STI and multi-layer electrodes were formed. It was found that leak current flowed.

STI has the liner layer of the silicon oxide layer in contact with the active region, the liner layer of the silicon nitride layer formed on the silicon oxide layer, and the silicon oxide layer formed on the silicon nitride layer. The interface between the oxide film and nitride film has the nature capable of trapping charges. The cause of leak current may be ascribed to the charged STI. As ultraviolet rays become incident upon STI, excited electrons reach the interface with the nitride film and there is a possibility that electrons are trapped.

In the multi-layer wiring forming processes, a resist layer is hardened by ultra violet (UV) curing using a UV lamp. It can be considered that during UV curing, ultraviolet rays become incident upon STI and charges are induced. A number of mask processes are performed to form a multi-layer wiring. STI is considered being charged by the number of UV irradiation. As an SiOC layer as a low dielectric constant insulating layer and an SiC layer as an etching stopper layer having a copper diffusion preventing ability are formed by PE-CVD, ultraviolet rays emitted from plasma are assumed to be irradiated to the silicon substrate. It can be considered inevitable that ultraviolet rays are irradiated to the silicon substrate during the multi-layer wiring forming processes.

Irradiation of ultraviolet rays to STI is expected to be suppressed if a layer having a high ultraviolet shielding ability exists between the multi-layer wiring and silicon substrate. The optical extinction coefficients of films were measured which films were made of various materials capable of being used as a lower insulating layer in the multi-layer wiring.

Figure 1A:
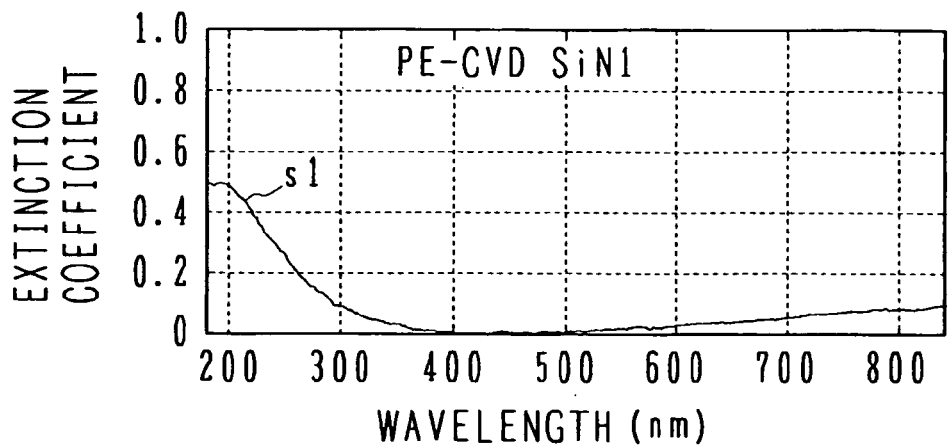
FIGS. 1A to 1C are graphs showing spectra of extinction coefficients of various silicon nitride films.
Figure 1B:
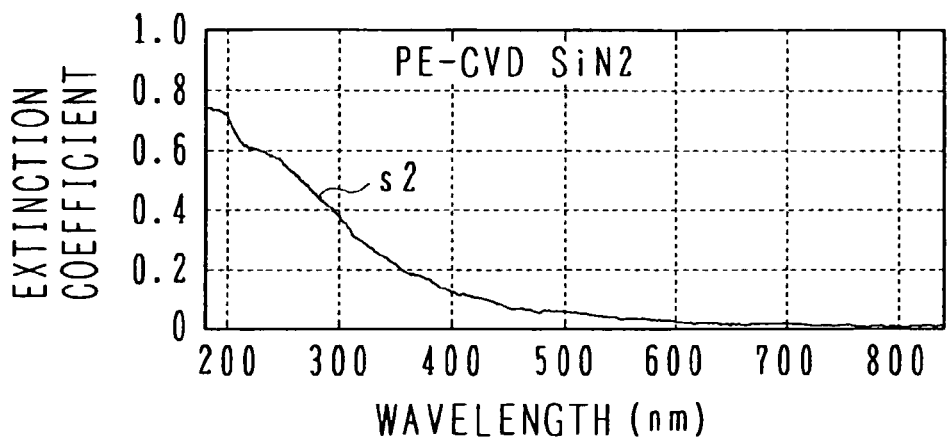
Figure 1C:
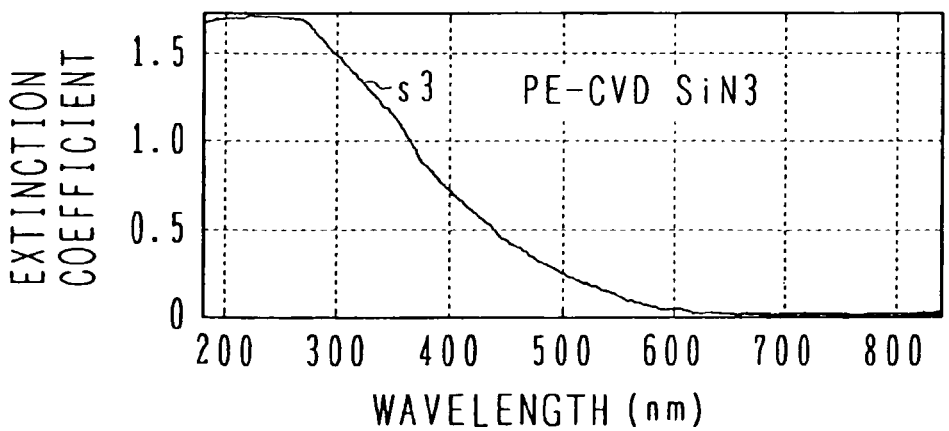

FIGS. 1A, 1B and 1C are graphs showing spectra of extinction coefficients of various types of silicon nitride layers (first, second and third samples). Light absorption increases exponentially relative to the product of a film thickness and an extinction coefficient, so that if a difference between extinction coefficients is large, a difference between light absorptions becomes very large.

FIG. 1A shows the spectrum of an extinction coefficient of a silicon nitride layer as the first sample. The first silicon nitride layer was formed by the following processes. "Concept2 sequal" manufactured by Novellus Systems, Inc. was used as a plasma enhanced (PE) CVD system. The first silicon nitride layer was formed by flowing $SiH_4$ at 480 sccm, $N_2$ at 1600 sccm and $NH_3$ at 4000 sccm as source gasses under the film forming conditions of an upper high frequency RF power of 440 W, a lower low frequency RF power of 550 W, a reaction chamber pressure of 2.6 torr and a temperature of 400° C. A spectrum s1 of the extinction coefficient is the measurement results of the first sample. Although light absorption is observed at the wavelength of 400 nm or shorter, the intensity is not high.

FIG. 1B shows the spectrum of an extinction coefficient of a silicon nitride layer as the second sample. The second silicon nitride layer was formed by the following processes. "Centura Dxz" manufactured by Applied Materials, Inc. was used as a PE-CVD system. The second silicon nitride layer was formed by flowing $SiH_4$ at 260 sccm, $N_2$ at 900 sccm and $NH_3$ at 240 sccm as source gasses under the film forming conditions of an RF power of 120 W, a pressure of 2.5 torr and a temperature of 400° C. As compared with the first sample, the flow rates of $NH_3$ and $N_2$ relative to $SiH_4$ as the Si source gas are considerably small. The second sample has an Si rich composition and is considered having a higher Si composition than the first sample s1. A spectrum s2 of the extinction coefficient is the measurement results of the second sample. Light absorption is observed from the visible light range, and as the wavelength becomes short, the extinction coefficient continues to increase. At the wavelength of 400 nm, the extinction coefficient is higher than that of the first silicon nitride layer at the wavelength of 300 nm. At the wavelength of 300 nm, a fairly strong light absorption exists.

FIG. 1C shows the spectrum of an extinction coefficient of a silicon nitride layer as the third sample. The third silicon nitride layer was formed by the following processes. "Centura Dxz" manufactured by Applied Materials, Inc. was used as a PE-CVD system. The third silicon nitride layer was formed by flowing $SiH_4$ at 32 sccm, $N_2O$ at 480 sccm and He at 4500 sccm as source gasses under the film forming conditions of an RF power of 320 W, a pressure of 4.5 torr and a temperature of 400° C. The nitridizing gas is changed to $N_2O$ and the RF power and pressure are raised. A spectrum s3 of the extinction coefficient is as the measurement results of the third sample. Similar to the second sample, light absorption is observed from the visible light range, and as the wavelength becomes short, the extinction coefficient continues to increase strongly. At the wavelength of 500 nm, the extinction coefficient is generally equal to that of the first silicon nitride layer at the wavelength of 300 nm. The extinction coefficient in the wavelength range of 300 to 400 nm is about a threefold of the second sample. In the ultraviolet range, a considerable strong light absorption exists. The third sample is considered having a higher Si composition than that of the first sample. The Si composition of the third sample is expected to be higher than that of the second sample.

Figure 2A:
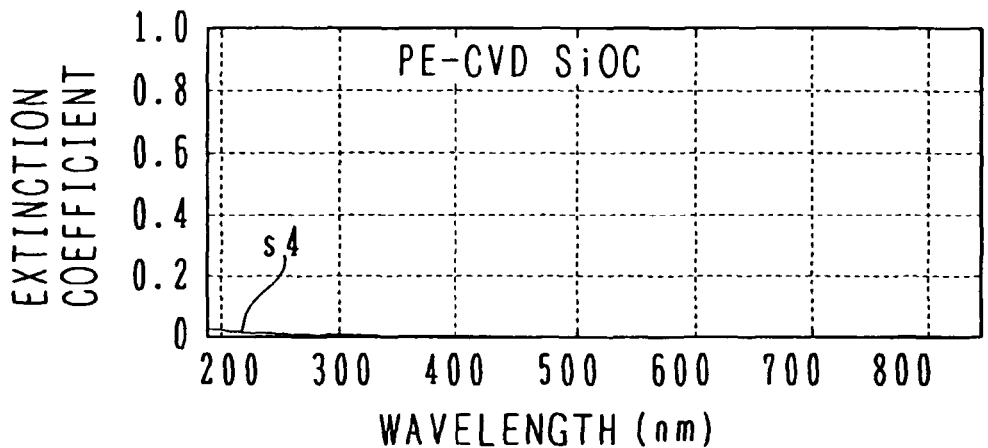
FIGS. 2A to 2C are graphs showing spectra of extinction coefficients of an SiOC layer and an SiC layer formed by PE-CVD and a polyallyl ether layer formed by coating.
Figure 2B:
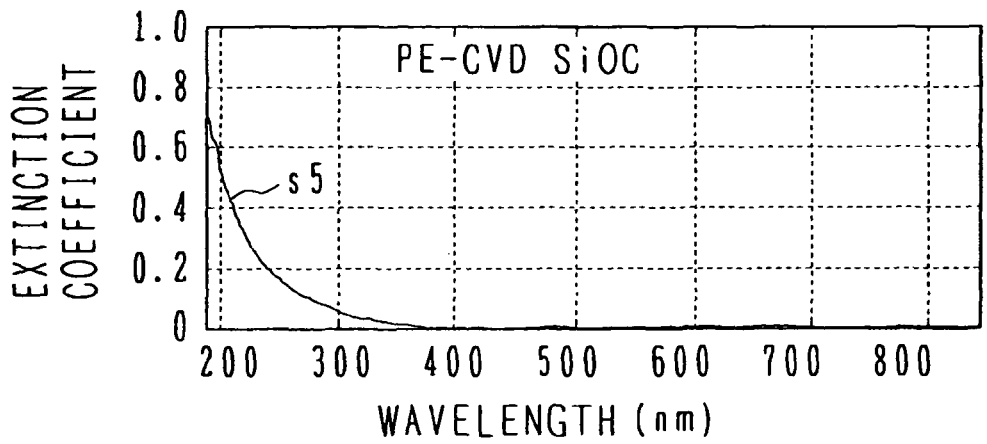
Figure 2C:
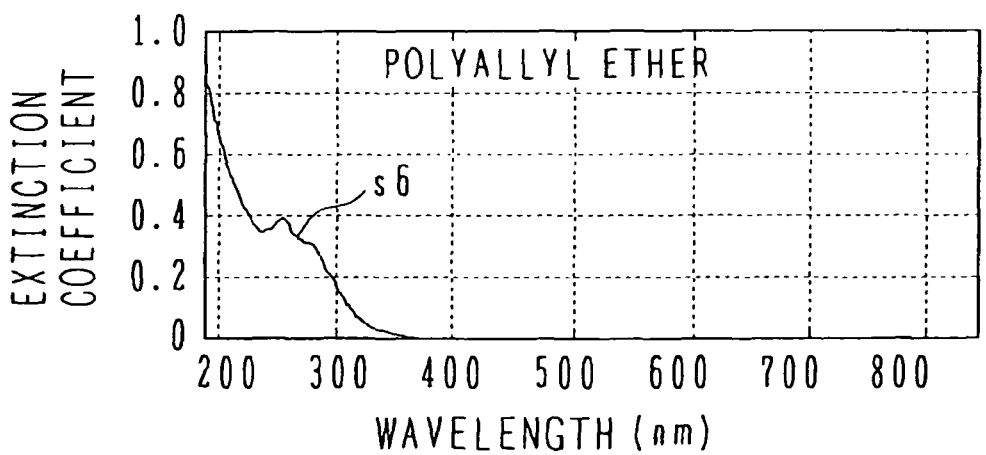

FIGS. 2A, 2B and 2C are graphs showing spectra of extinction coefficients of other insulating films including an SiOC film (fourth sample) formed by PE-CVD, an SiC film (fifth sample) formed by PE-CVD and a polyallyl ether film (sixth sample).

FIG. 2A shows the spectrum of an extinction coefficient of the SiOC film as the fourth sample. The SiOC film as the fourth sample was formed by the following processes. "Concept2 sequal" manufactured by Novellus Systems, Inc. was used as a PE-CVD system. The SiOC film was formed by flowing $CO_2$ at 5000 sccm and tetramethylcyclo tetrasiloxane at 5 cc/sec as source gasses under the film forming conditions of an upper high frequency RF power of 600 W, a lower low frequency RF power of 400 W, a reaction chamber pressure of 4.0 torr and a temperature of 400° C. A spectrum s4 of the extinction coefficient is the measurement results of the fourth sample. Although small light absorption is observed at the wavelength of 300 nm or shorter, it can be said that light absorption in the ultraviolet range hardly exists.

FIG. 2B shows the spectrum of an extinction coefficient of the SiC film as the fifth sample. The SiC film as the fifth sample was formed by the following processes. "Concept2 sequal" manufactured by Novellus Systems, Inc. was used as a PE-CVD system. The SiC film was formed by flowing tetramethylsilane at 500 sccm and $CO_2$ at 2500 sccm under the film forming conditions of an upper high frequency RF power of 600 W, a lower low frequency RF power of 400 W, a reaction chamber pressure of 1.8 torr and a temperature of 400° C. A spectrum s5 of the extinction coefficient is the measurement results of the fifth sample. Although light absorption of ultraviolet rays starts increasing from a wavelength of 400 nm, the extinction coefficient at a wavelength of 300 nm is smaller than that of the SiN film of the first sample. The extinction coefficient increases greatly at the wavelength of about 240 nm or shorter. This absorption range is considered having a small superposition upon the wavelength range of a UV lamp. The light absorption in the range of ultraviolet rays emitted from a UV lamp is considered being equal to or smaller than that of the first sample.

FIG. 2C shows the spectrum of an extinction coefficient of the polyallyl ether film as the sixth sample. The polyallyl ether film as the sixth sample was formed by the following processes. SiLK (registered trademark) manufactured by Dow Chemical Company was used as polyallyl ether. A polyallyl ether film was formed on a silicon wafer by spin coating. After the film was baked on a hot plate at 300° C., it was annealed in a furnace in an $N_2$ atmosphere at 400° C. A spectrum s6 of the extinction coefficient is the measurement results of the sixth sample. Although light absorption hardly exists at a wavelength of 400 nm, the extinction coefficient increases at a wavelength of about 350 nm or shorter, and at a wavelength of 300 nm, the extinction coefficient is about a twofold of that of the first sample.

Figure 3A:
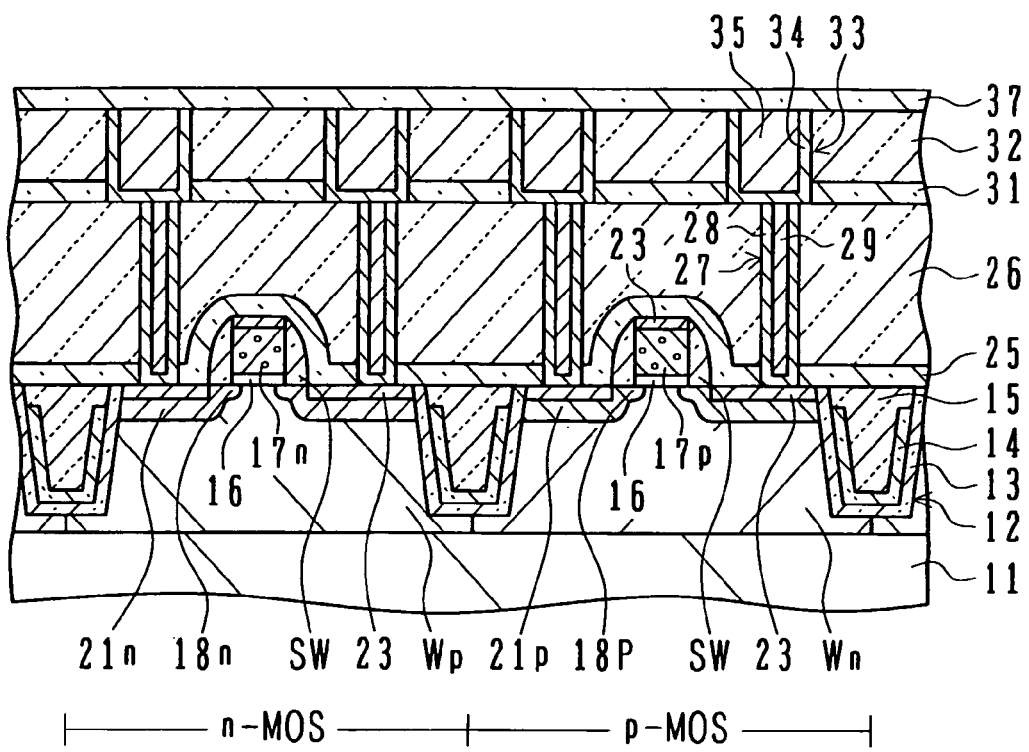
FIGS. 3A and 3B are cross sectional views of a semiconductor device according to an embodiment and a semiconductor device according to a comparative example.

FIG. 3A is a cross sectional view schematically showing the structure of a semiconductor device according to the first embodiment. A shallow trench 12 is formed in the surface layer of a silicon substrate 11. For example, a silicon oxide layer having a thickness of 9 to 21 nm, e.g., 10 nm, is formed on the surface of the silicon substrate 11 by thermal oxidation. On this silicon oxide film, a silicon nitride film having a thickness of 100 to 150 nm, e.g., 110 nm, is formed by low pressure (LP) chemical vapor deposition (CVD). For example, LPCVD is performed by using $SiCl_{2H}2$ and $NH_3$ as source gasses at a temperature of 750° C. to 800° C. Since the film thickness is relatively thick, the film forming temperature is set higher to increase the film forming speed.

On the silicon nitride layer, a resist pattern is formed covering the active region (element forming region). An opening of the resist pattern defines the element isolation region. The width of the opening is, for example, 0.1 to 1 μm. By using the resist pattern as an etching mask, the silicon nitride film and silicon oxide film are etched. The resist pattern may be removed at this stage.

By using the etched silicon nitride layer as an etching mask, the silicon substrate is anisotropically etched by reactive ion etching (RIE). The silicon substrate 11 is etched, for example, by a depth of 300 nm to form the trench 12. The silicon nitride layer and silicon oxide layer are etched by using a mixed gas of $CF_4$, $CHF_3$ and Ar as etching gasses. The silicon substrate 11 is etched by a mixed gas of HBr and $O_2$ or a mixed gas of $Cl_2$ and $O_2$.

The silicon substrate surface exposed on the surface of the trench 12 is thermally oxidized to form a silicon oxide layer liner 13 having a thickness of, for example, 3 nm. The whole silicon surface exposed in the trench 12 is covered with the silicon oxide layer liner 13. A silicon nitride layer liner 14 having a tensile stress is further formed by LPCVD. A strong stress is given if the silicon nitride layer liner 14 is thick. However, if it is too thick, the remaining opening is made narrow and it becomes hard to bury the opening even with an HDP silicon oxide film. The thickness of the silicon nitride layer liner 14 is set to, for example, 20 nm. LPCVD is performed by using a mixed gas of $SiCl_{2H}2$ and $NH_3$ as source gasses at a temperature lower than 680° C., e.g., about 650° C. Since the film thickness is relatively thin, the film forming temperature is set to a relatively low temperature to lower the film forming speed. As the source gasses, silane ($SiH_4$) and ammonia ($NH_3$), tetrachlorsilane ($SiCl_4$) and ammonia, bis-tertialbutylaminosilane (BTBAS), or the like may be used. The liner of the silicon nitride layer has a tensile stress of 1.2 GPa or more. This stress has a direction opposite to that of a burying silicon oxide layer after a heat treatment for making dense the layer to be described later. After the SiN layer liner is formed, a heat treatment at 1000° C. to 1150° C. such as rapid thermal annealing (RTA) may be performed. For example, a heat treatment in an $N_2$ atmosphere at 1000° C. for 30 seconds can increase the tensile stress of the SiN layer by 20 to 30%.

Organic material having the composition equivalent to that of resist is filled in the trench, the upper portion of the organic material is removed and the upper portion of the silicon nitride layer liner 14 is selectively removed. The substrate formed with the silicon nitride layer liner 14 is subjected to pre-annealing at 400° C. to 450° C. for 1 to 5 minutes in a high density plasma (HDP) CVD system, and successively a silicon oxide layer 15 is formed and filled in the trench by HDPCVD in the same chamber. For example, if a trench having a depth of 300 nm is formed, the thickness of the burying silicon oxide layer 15 is set to about 500 nm at the flat portion.

The silicon oxide layer 15 is formed by using as source gasses a mixed gas of $SiH_4$ and oxygen or a mixed gas of TEOS and ozone. After the silicon oxide layer 15 is grown, annealing at about 1000° C. is performed to make the silicon oxide layer 15 dense. The layer quality of the silicon oxide layer 15 in the trench after the annealing is almost the same as that of the thermally oxidized layer. Although the dense silicon oxide layer has a compressive stress, this compressive stress has a direction opposite to that of the tensile stress in the silicon nitride layer liner so that the compressive stress is cancelled out by the tensile stress. An electron mobility to be lowered by the compressive stress can be reduced.

An unnecessary insulating film on the surface of the silicon substrate is removed by chemical mechanical polishing (CMP) to form STI. The silicon nitride layer on the substrate surface functions as a polishing stopper. Instead of CMP, RIE using a mixed gas of $CF_4$ and $CHF_3$ may be used. The silicon nitride layer used as the stopper is etched by hot phosphoric acid. Thereafter, the silicon oxide film on the surface of the silicon substrate 11 is removed by dilute phosphoric acid.

A sacrificial oxide layer is grown by thermally oxidizing the surface of the silicon substrate 11. By using the sacrificial oxide film as a through oxide film, ions are implanted into the surface region of the silicon substrate 11. Implanted impurity ions are activated to form a well of a predetermined conductivity type in the active region defined by STI. For example, a p-type well Wp to be used for forming an n-channel MOS transistor and an n-type well Wn to be used for forming a p-channel MOS transistor are formed by separate ion implantation processes using resist masks. After the wells Wn and Wp are formed, the sacrificial oxide layer is removed by dilute phosphoric acid.

A gate insulating film 16 is formed on the active region surface. For example, the gate insulating film 16 is a silicon oxynitride layer having a thickness of 2 nm or thinner obtained by nitridizing a thermally oxidized layer. The structure using high dielectric constant material such as $HfO_2$ my be adopted as the gate insulating film. A polysilicon layer (used as an n-type polysilicon layer 17n and a p-type polysilicon layer 17p through impurity implantation) is deposited on the gate insulating film 16 by thermal CVD, and patterned to form an insulated gate electrode. The p-type MOS region (n-type well Wn) is masked by a resist pattern and n-type impurity ions are implanted shallowly into the n-MOS region (p-type well Wp) to form an n-type extension region 18n. Similarly, the n-type MOS region (p-type well Wp) is masked by a resist film and p-type impurity ions are implanted shallowly into the p-MOS region (n-type well Wn) to form a p-type extension region 18p. An insulating layer of silicon oxide or the like is deposited on the silicon substrate, covering the gate electrode, and anisotropic etching (RIE) is performed to leave side wall spacers SW only on the side walls of the gate electrode.

After the side wall spacers SW are formed, n-type and p-type impurity ions are selectively implanted into the n-MOS region (p-type well Wp) and p-MOS region (n-type well Wn) to form n-type source/drain diffusion layers 21n and p-type source/drain diffusion layers 21p. Impurities are also implanted into the gate electrodes of polysilicon so that an n-type gate electrode 17n and a p-type gate electrode 17p are formed. A metal layer capable of being silicidated is deposited on the substrate surface, covering the gate electrodes, and the silicide reaction is conducted to form a silicide layer 23 on the gate electrode surface and the source/drain diffusion region surface. In this manner, a CMOS transistor structure is formed.

A variety of well-known structures may be used as the CMOS transistor structure. For the general structure of a semiconductor device and its manufacture method, refer to, for example, U.S. Pat. No. 6,707,156 which is incorporated herein by reference.

A contact etch stopper layer 25 of silicon nitride is deposited on the silicon substrate, covering the CMOS transistor structure. This silicon nitride layer is formed by thermal CVD, for example, under the following conditions. As a thermal CVD system, "centura" manufacture by Applied Materials, Inc. is used. The silicon nitride film having the quality suitable for forming a contact etch stopper on the silicon substrate surface is formed by thermal CVD by flowing $N_2$ at 5000 sccm, $NH_3$ at 7000 sccm and $Si_2H_6$ at 19 sccm at a pressure of 300 torr and a temperature of 600° C.

On the contact etch stopper layer 25, a phosphosilicate glass (PSG) layer 26 is formed as a lower interlayer insulating film, for example, by thermal CVD. A contact hole 27 is formed through the lower interlayer insulating layer 26 and contact etch stopper layer 25, a barrier layer 28 of TiN or the like is deposited and thereafter a W layer 29 is buried and an unnecessary portion is removed by CMP to form a conductive plug. On the lower interlayer insulating layer 26 buried with the conductive plug, a silicon nitride layer 31 having the ultraviolet shielding ability such as the above-described second and third samples is deposited to a thickness of about 50 nm by PE-CVD.

On the silicon nitride layer 31, an SiOC layer 32 not having the ultraviolet shielding ability is deposited to a thickness of about 130 nm by PE-CVD. A resist pattern is formed on the SiOC layer 32 and hardened through UV irradiation. For example, two-step curing is performed at 110° C. for 10 seconds and at 230° C. for 30 seconds by using "Fusion 200" manufactured by Axcelis Technologies, Inc. as a UV curing system. By using the hardened resist pattern as a mask, a wiring trench 33 is formed through the SiOC layer 32 and SiN layer 31. After a barrier layer 34 of Ta is formed, a copper layer 35 is buried through plating or the like, and an unnecessary portion is removed to form a copper wiring pattern. Covering the copper wiring pattern, an SiC layer 37 having the oxygen intercepting ability and copper diffusion preventing ability is deposited to a thickness of about 50 nm by PE-CVD. If necessary, the interlayer insulating layer forming and damascene wiring forming processes are repeated to form a multi-layer wiring.

Figure 3B:
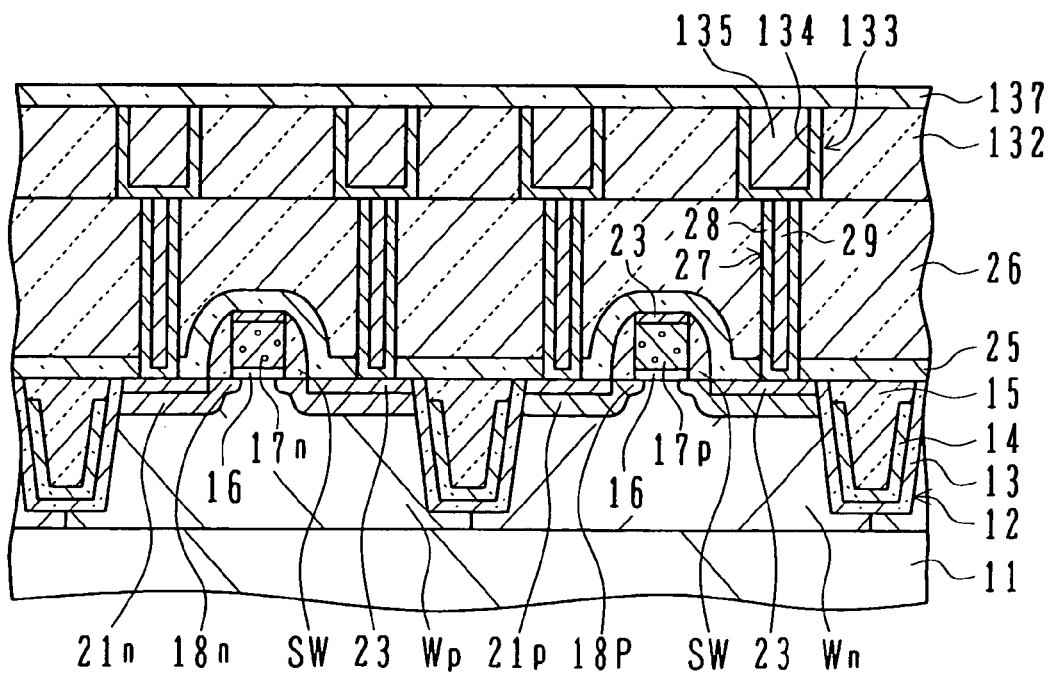

FIG. 3B is a cross sectional view schematically showing the structure of a comparative sample. The structure from the silicon substrate 11 to the lower interlayer insulating layer 26 and to the conductive plug 28, 29 is similar to that shown in FIG. 3A. After the conductive plug is formed, an SiOC layer 132 is deposited on the lower interlayer insulating layer 26 to a thickness of about 130 nm by PE-CVD. A wiring trench 133 is formed in the SiOC layer 132 and after a barrier layer 134 of Ta or the like is deposited, a copper layer 135 is buried. After an unnecessary metal layer is removed, an SiC layer 137 having a thickness of 50 nm is formed by PE-CVD, covering the copper wiring pattern. Namely, the comparative sample is different from the sample shown in FIG. 3A in that it does not have the SiN layer 31 having the ultraviolet shielding ability.

Figure 4A:
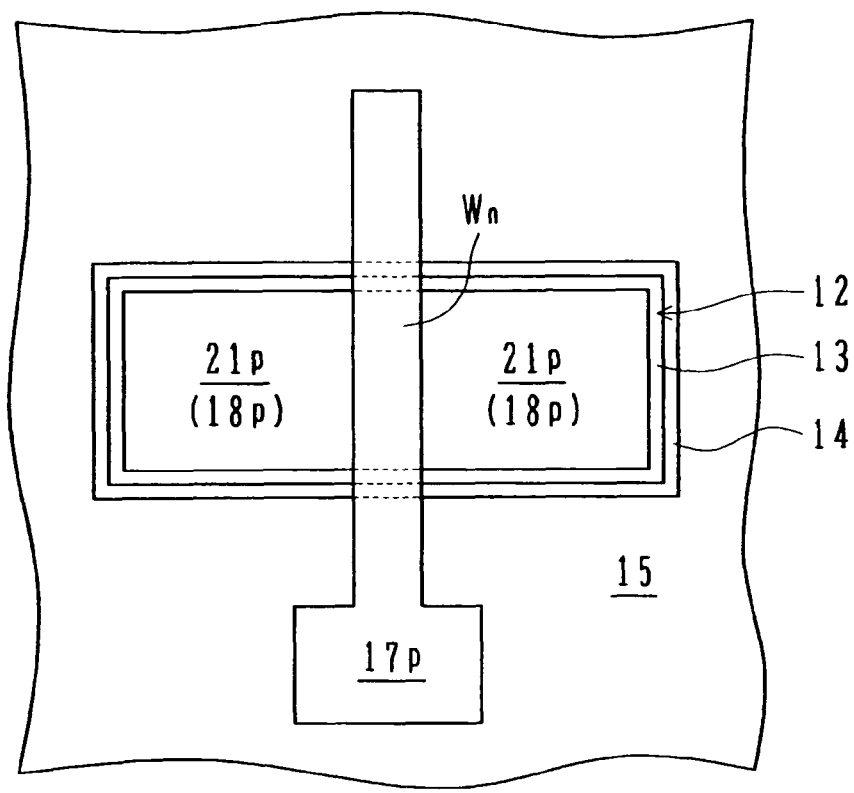
FIGS. 4A and 4B a plan view schematically showing the plan structure of a p-channel MOS transistor, and a graph showing the characteristics of the drain current Ids relative to the gate voltage Vg of the samples shown in FIGS. 3A and 3B.

FIG. 4A is a schematic plan view showing the plan structure of the p-channel MOS transistor shown in FIGS. 3A and 3B. The trench 12 is formed surrounding the active region, the silicon oxide layer liner 13 is formed by thermally oxidizing the Si surface exposed on the inner wall of the trench, the silicon nitride layer liner 14 is formed on the silicon oxide layer liner 13, and the HDP silicon oxide layer 15 is formed burying the trench. The gate electrode of the p-type polysilicon layer 17p is formed traversing the central area of the active region, with the gate insulating film being interposed. On both sides of the gate electrode 17p, the source/drain extension regions 18p and source/drain diffusion layers 21p doped with p-type impurity ions are formed. Under the gate electrode 17p, the n-type well region Wn is left to form a channel region.

As the silicon nitride layer 14 traps electrons, although the source/drain regions 21p having a high impurity concentration are hardly influenced, the n-type channel region Wn is influenced by negative charges and has a possibility that a depletion layer and an inversion layer are formed.

Figure 4B:
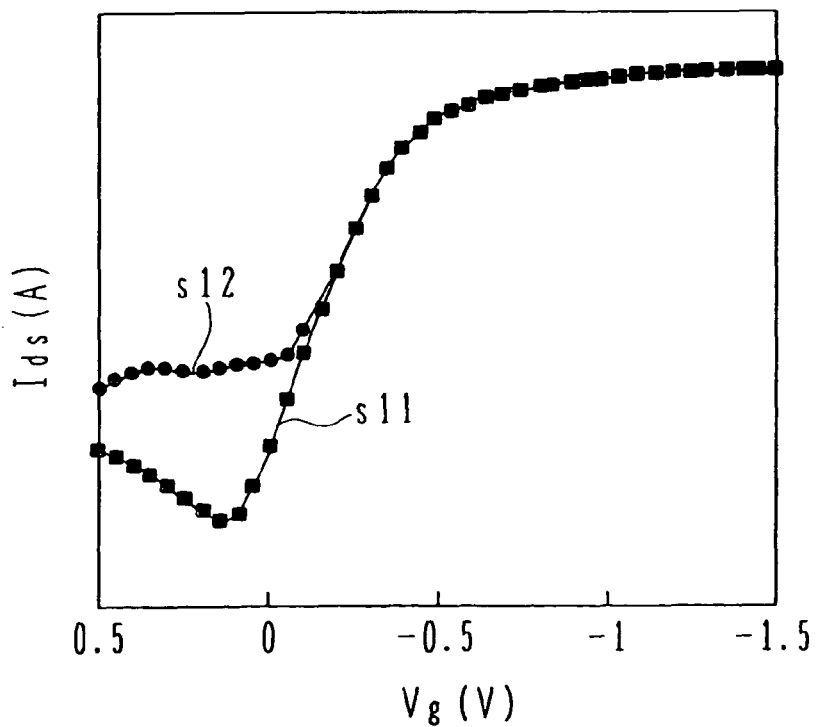

FIG. 4B is a graph showing the characteristics of a drain current Ids and a gate voltage Vg of the embodiment sample shown in FIG. 3A and the comparative sample shown in FIG. 3B. The characteristics s11 of the embodiment sample shown in FIG. 3A show that the drain current is saturated in the on-state of the gate voltage. As the absolute value of the gate voltage is reduced, the drain current continues to reduce, and in the off-state the drain current lowers to a very small value. As the gate voltage is raised at the opposite polarity, the drain current rises slightly. In contract, the characteristics s12 of the comparative sample shown in FIG. 3B show the saturated current almost equal to that of the characteristics s11. As the absolute value of the gate voltage is reduced, the drain current Ids reduces to some degree and thereafter a reduction in the drain current stops, which indicates the existence of leak current. It can be considered that negative charges are accumulated on the side wall of STI and a parasitic MOS transistor always turned on exists. The embodiment sample can be considered that the formation of a parasitic MOS transistor is prevented or suppressed. In an n-channel MOS transistor, even if negative charges are formed on the STI side wall, the channel becomes only more off and the leak current is assumed not to be generated. However, if the region in contact with the SIT side wall becomes a parasitic transistor always turned off, the effective channel width is narrowed. A reduction in the drain current may cause some problem in a finer n-channel MOS transistor.

From the characteristics shown in FIG. 4B, a reduction in the leak current may be ascribed to the SiN layer 31 having the ultraviolet shielding ability formed on the lower interlayer insulating film 26 in the MOS transistor structure shown in FIG. 3A. Namely, the SiN layer 31 exhibits the ultraviolet shielding ability relative to ultraviolet rays irradiated from the upper position and prevents or suppresses the ultraviolet rays from irradiating STI. It can therefore be considered that charges are not accumulated in STI and an increase in the leak current is suppressed.

Figure 5A:
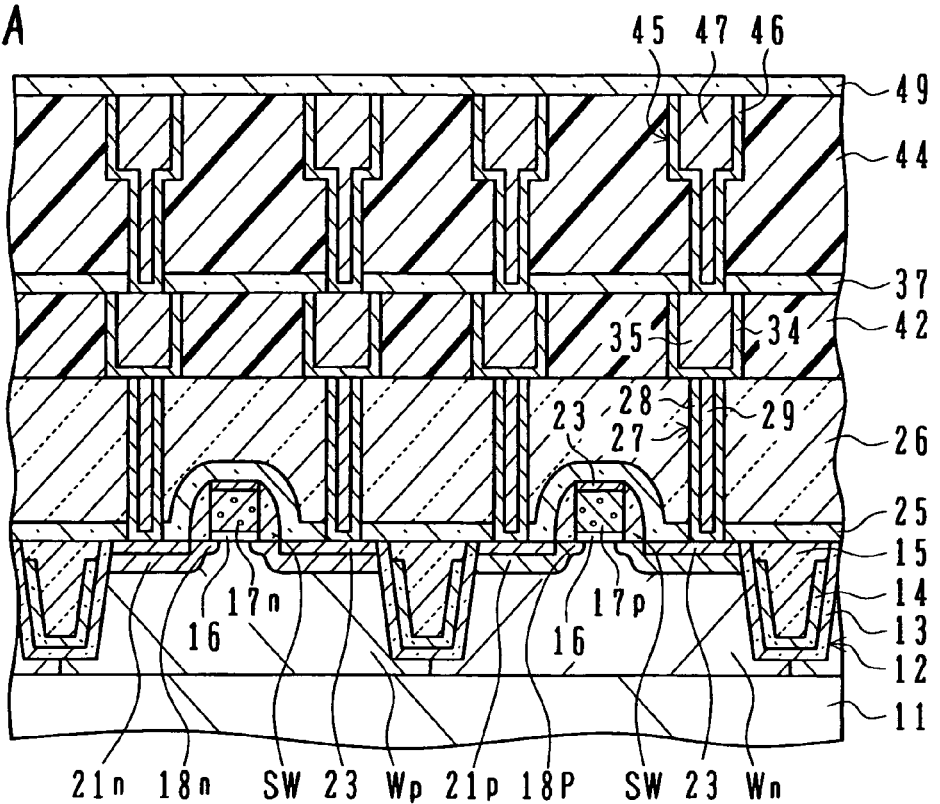
FIGS. 5A and 5B are schematic cross sectional views of a semiconductor device according to an embodiment and a semiconductor device according to a comparative example.

FIG. 5A is a schematic cross sectional view showing the structure of a semiconductor device according to another embodiment. The processes up to forming the lower interlayer insulating layer 26 and conductive plug are similar to those described with reference to FIG. 3A. An organic insulating layer 42 of polyallyl ether is formed on the lower interlayer insulating layer 26 to a thickness of 130 nm. A wiring pattern trench is formed and a copper wiring constituted of a barrier layer 34 and a copper layer 35 is buried in the trench. On the organic insulating layer 42 of polyallyl ether buried with the copper wiring, an SiC layer 37 having a thickness of 50 nm is formed by PE-CVD. On the SiC layer 37, an organic insulating layer 44 of polyallyl ether is formed to a thickness of 250 nm as an interlayer insulating film. A trench 45 for dual damascene copper wiring is formed in the organic insulating layer 44 of polyallyl ether, and a barrier layer 46 and a copper layer 47 are buried to form a dual damascene copper wiring. An SiC layer 49 is formed on the dual damascene wiring to a thickness of 50 nm by PE-CVD. If necessary, the interlayer insulating layer forming and wiring layer forming processes are repeated.

Figure 5B:
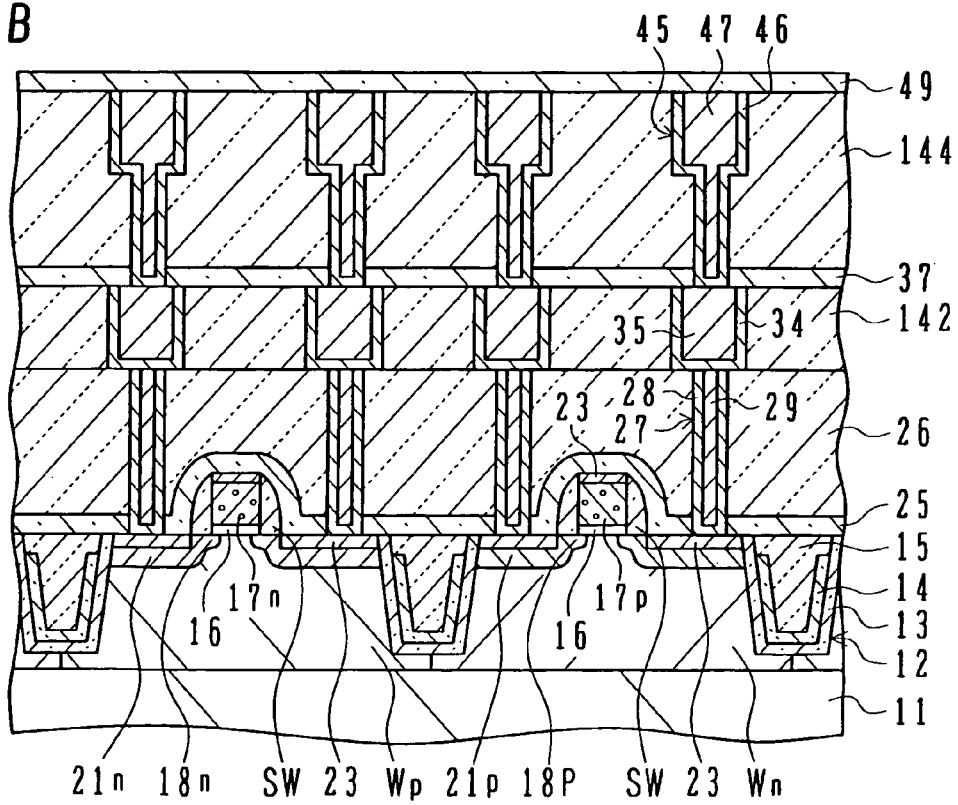

FIG. 5B shows the structure of a comparative example. As compared to the structure shown in FIG. 5A, a different point is that the polyallyl ether layers 42 and 44 are replaced with SiOC layers 142 and 144 formed by PE-CVD.

Figure 6:
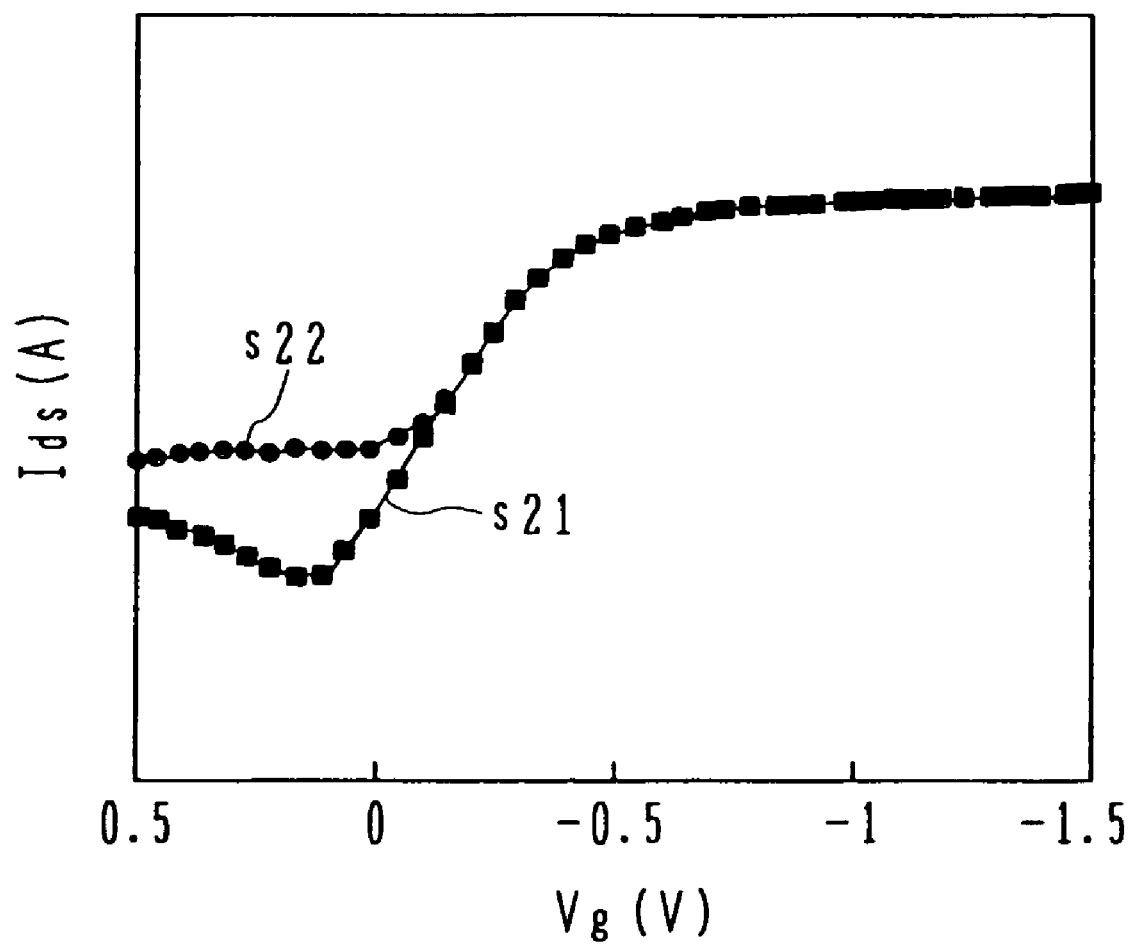
FIG. 6 is a graph showing the characteristics of the drain current Ids relative to the gate voltage Vg of the samples shown in FIGS. 5A and 5B.

FIG. 6 is a graph showing the characteristics of a drain current Ids and a gate voltage Vg of the semiconductor devices shown in FIGS. 5A and 5B. A curve s21 shows the characteristics of the embodiment sample shown in FIG. 5A, and a curve s22 shows the characteristics of the comparative sample shown in FIG. 5B. The curve S22 of the drain current Ids of the comparative sample shown in FIG. 5B does not become lower than some level, indicating that leak current exists. The curve S21 of the embodiment sample shows that the drain current Ids lower to a very small value and thereafter rises slightly. Similar to the comparative example shown in FIG. 3B, in the comparative example shown in FIG. 5B, it can be considered that a parasitic MOS transistor always turned on exists. In the embodiment sample shown in FIG. 5A, the formation of a parasitic MOS transistor is prevented or suppressed.

In the structure shown in FIG. 5A, the SiOC layer in the structure shown in FIG. 5B is replaced with the polyallyl ether layer. As apparent from the graph shown in FIG. 2A, SiOC hardly exhibits light absorption in the ultraviolet range. In contrast, as shown in FIG. 2C, polyallyl ether exhibits light absorption which rises relatively abruptly at a wavelength of about 350 nm or shorter. Since the organic insulating layers 42 and 44 of polyallyl ether are thick, fairly strong light absorption can be expected. It can therefore be considered that leak current is reduced in the structure shown in FIG. 5A.

As described above, as the film having a ultraviolet shielding ability is formed at the lower portion of the multi-layer wiring and above the transistors, charge accumulation at the interface with the SiN layer liner can be prevented even if the multi-layer wiring forming processes including ultraviolet irradiation are performed. It is therefore possible to retain the good transistor characteristics and provide a high performance transistor. The contact etch stopper layer having the ultraviolet shielding ability is not limited only to the SiN layer. Other insulating layers containing Si rich SiN in their composition are also expected to be used. The organic insulating layer having the ultraviolet shielding ability is also not limited to the polyallyl ether layer. Other organic insulting layers having benzene rings are also expected to be used.

The present invention has been described in connection with the preferred embodiments. The invention is not limited only to the above embodiments. It will be apparent to those skilled in the art that other various modifications, improvements, combinations, and the like can be made.

What I claim are:

1. A semiconductor device comprising:
a silicon substrate;
trench formed downward from a surface of said silicon substrate, said trench defining active regions in the surface of said silicon substrate;
a liner layer of a silicon nitride film covering an inner wall of said trench;
an element isolation region of silicon oxide formed on said liner layer, and filling said trench;
an n-type well formed in one of said active regions, the n-type well being surrounded, in plan view, with said liner layer of the silicon nitride film;
a p-channel MOS transistor formed in and on said n-type well;
a contact etch stopper layer formed on said silicon substrate, directly covering said p-channel MOS transistor;
a lower interlayer insulating film formed on said contact etch stopper layer;
a light shielding film of a Si-rich silicon nitride layer having ultraviolet shielding ability and formed on said lower interlayer insulating layer above said liner layer and said contact etch stopper layer,
an intermediate interlayer insulating film formed on said light shielding film, and having a wiring trench; and
wiring embedded in said wiring trench;
wherein said light shielding film and bottom of said wiring trench have complementary shapes.

2. The semiconductor device according to claim 1, further comprising
a diffusion preventing layer formed on said intermediate interlayer insulating film and covering said wiring, said diffusion preventing layer having an oxygen intercepting ability and a wiring metal diffusion preventing ability and not having the ultraviolet shielding ability.

3. The semiconductor device according to claim 2, wherein said wiring is a copper wiring.

4. The semiconductor device according to claim 2, wherein the intermediate interlayer insulating film does not have the ultraviolet shielding ability.

5. The semiconductor device according to claim 1, wherein the lower interlayer insulating film is a silicon-oxide-containing insulating layer.

6. The semiconductor device according to claim 5, wherein the lower interlayer insulating film does not have the ultraviolet shielding ability.

7. The semiconductor device according to claim 1, wherein the contact etch stopper layer is made of a silicon nitride layer.

8. The semiconductor device according to claim 7, wherein the silicon nitride layer of said light shielding film has an Si composition larger than an Si composition of the silicon nitride layer of said contact etch stopper layer.

9. The semiconductor device according to claim 1, further comprising a lower liner layer of a silicon oxide layer covering the inner wall of said trench under said liner layer of the silicon nitride layer.

10. The semiconductor device according to claim 1, wherein the silicon nitride film of said liner layer has an upper end retracted from the surface of said silicon substrate.

11. The semiconductor device according to claim 1, wherein the contact etch stopper layer does not have the ultraviolet shielding ability.

12. The semiconductor device according to claim 1, wherein said element isolation region is formed of silicon oxide.

13. The semiconductor device according to claim 1, wherein a gate electrode of the p-channel MOS transistor directly overlies said liner of the silicon nitride film.

* * * * *